(12) United States Patent
Bowers

(10) Patent No.: US 11,482,500 B2
(45) Date of Patent: Oct. 25, 2022

(54) METHOD OF FORMING AN ELECTRONIC DEVICE STRUCTURE HAVING AN ELECTRONIC COMPONENT WITH AN ON-EDGE ORIENTATION AND RELATED STRUCTURES

(71) Applicant: Amkor Technology Singapore Holding Pte. Ltd., Valley Point (SG)

(72) Inventor: Shaun Bowers, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 17/077,007

(22) Filed: Oct. 22, 2020

(65) Prior Publication Data

US 2021/0043589 A1    Feb. 11, 2021

Related U.S. Application Data

(62) Division of application No. 15/907,039, filed on Feb. 27, 2018, now Pat. No. 10,847,478.

(51) Int. Cl.
| | |
|---|---|
| *H01L 23/66* | (2006.01) |
| *H01L 23/64* | (2006.01) |
| *H01L 23/498* | (2006.01) |
| *H01L 25/00* | (2006.01) |
| *H01L 23/00* | (2006.01) |

(Continued)

(52) U.S. Cl.
CPC .............. *H01L 23/66* (2013.01); *H01L 21/50* (2013.01); *H01L 23/4985* (2013.01); *H01L 23/645* (2013.01); *H01L 24/10* (2013.01); *H01L 25/50* (2013.01); *H01L 2021/60022* (2013.01); *H01L 2021/6027* (2013.01)

(58) Field of Classification Search
CPC ......... H01L 23/66; H01L 21/50; H01L 24/10; H01L 25/50; H01L 23/645; H01L 23/4985; H01L 2021/60022; H01L 2021/6027

See application file for complete search history.

(56) References Cited

U.S. PATENT DOCUMENTS

| 7,049,216 B2 | 5/2006 | Rinne |
| 7,659,621 B2 | 2/2010 | Rinne |

(Continued)

FOREIGN PATENT DOCUMENTS

CN    101840893 A  *  9/2010

*Primary Examiner* — Latanya N Crawford Eason
(74) *Attorney, Agent, or Firm* — Kevin B. Jackson

(57) ABSTRACT

A method of forming an electronic device structure includes providing an electronic component having a first major surface, an opposing second major surface, a first edge surface, and an opposing second edge surface. A substrate having a substrate first major surface and an opposing substrate second major surface is provided. The second major surface of the first electronic component is placed proximate to the substrate first major surface and providing a conductive material adjacent the first edge surface of the first electronic component. The conductive material is exposed to an elevated temperature to reflow the conductive material to raise the first electronic component into an upright position such that the second edge surface is spaced further away from the substrate first major surface than the first edge surface. The method is suitable for providing electronic components, such as antenna, sensors, or optical devices in a vertical or on-edge.

20 Claims, 7 Drawing Sheets

(51) Int. Cl.
  *H01L 21/50* (2006.01)
  *H01L 21/60* (2006.01)

(56) References Cited

U.S. PATENT DOCUMENTS

| | | | |
|---|---|---|---|
| 7,944,061 B2 | 5/2011 | Bauer | |
| 8,053,891 B2* | 11/2011 | Feng | H01L 23/13 |
| | | | 257/738 |
| 8,058,727 B2* | 11/2011 | Feng | H01L 23/49816 |
| | | | 257/738 |
| 8,138,099 B1 | 3/2012 | Daubenspeck | |
| 8,278,748 B2 | 10/2012 | Lo | |
| 8,692,367 B1 | 4/2014 | Lo | |
| 9,159,684 B1 | 10/2015 | Lo | |
| 9,490,195 B1* | 11/2016 | Prabhu | H01L 23/49541 |
| 2002/0170290 A1 | 11/2002 | Bright | |
| 2008/0315388 A1* | 12/2008 | Periaman | H01L 25/0652 |
| | | | 257/690 |
| 2008/0315399 A1 | 12/2008 | Bauer | |
| 2010/0078804 A1* | 4/2010 | Grusby | B81B 7/0074 |
| | | | 257/698 |
| 2011/0198745 A1 | 8/2011 | Lo | |
| 2018/0040544 A1* | 2/2018 | Katkar | H05K 3/3405 |
| 2018/0040587 A1* | 2/2018 | Tao | H01L 24/24 |

\* cited by examiner

METHOD OF FORMING AN ELECTRONIC DEVICE STRUCTURE HAVING AN ELECTRONIC COMPONENT WITH AN ON-EDGE ORIENTATION AND RELATED STRUCTURES

CROSS-REFERENCE TO RELATED APPLICATIONS

The present application is a divisional application of co-pending U.S. patent application Ser. No. 15/907,039 filed on Feb. 27, 2018 and issued as U.S. Pat. No. 10,474,478 on Nov. 24, 2020, which is expressly incorporated by reference herein, and priority thereto is hereby claimed.

BACKGROUND OF THE DISCLOSURE

The present invention relates, in general, to electronics, and more particularly, to electronic structures, configurations thereof, and methods of forming electronic structures.

Wireless and portable handheld communication applications are examples of applications continuing to grow and evolve with an increased effort to integrate more electronic functionality into smaller, lighter, thinner, and lower cost solutions. One of the continuing challenges for these applications is the improvement and integration of effective antennas into the various product platforms. In the past, assembly structures for handheld communication applications have used flexible cable or flexible circuit structures to orient various antenna devices in different directions with respect to the integrated circuits the antenna devices are co-packaged with. In the assembly structures, the flexible cables are bent to orient the antenna devices into desired locations to provide 3-axis coverage for specific communication applications. The flexible cables add complexity to the assembly process, add bulk to the assembly structures, and can lead to reliability issues as the flexible cables age and are exposed to harsh environmental conditions.

In addition, as cellular networks continue to advance to next generations, such as 5G, many engineering challenges need to be addressed. For example, beamforming, which helps to focus a signal in a concentrated beam that points only in the direction of user, will require antennas to provide 3-axis (i.e., x, y and z axis) directional capability at multiple locations on assembly structures for communication applications. For example, it is anticipated that in 5G applications, multiple antenna devices may be placed in at least two separate locations to provide 3-axis signal coverage. This will be a challenge for manufacturers particularly with continued demands for smaller, lighter, thinner, and lower cost solutions.

Accordingly, it is desirable to have a method and a structure that provides packaged electronic devices that overcome the issues associated with flexible cable assemblies and that support next generation cellular network technology. In addition, it would be beneficial for the method and structure utilize existing manufacturing equipment, and for the method and structure to support multiple electronic applications, such as antenna, optical, and sensing device applications.

BRIEF SUMMARY

The present description includes, among other features, a method of forming an electronic device structure and associated structures that have an electronic component provided in an on-edge or an upright configuration. In some examples, an edge of an electronic component is placed adjacent a conductive pattern on a substrate. A conductive material is placed adjacent the edge and the conductive pattern. The conductive material is exposed to elevated temperature configured to reflow the conductive material. During the reflow process, a surface tension effect acts to raise or rotate the electronic component upward into an upright or on-edge orientation. In some examples, the conductive material includes a solder and conductive bumps, which can be substantially equally distributed along the edge of the electronic component. In some examples, the electronic component can be an antenna structure, such as a semiconductor antenna structure. In other examples, the electronic component can be a sensor device, such as an image sensor device. In some examples, the electronic component is a bare semiconductor die or chip (i.e., unpackaged). In some embodiments, the electronic component includes a conductive electrically connected to one or more of the conductive bumps disposed along the edge. In some examples, the conductive pattern can be on both sides of the electronic component. Multiple electronic components can be disposed on a substrate in both an on-edge configuration and in a conventionally attach configuration to provide an electronic device structure having 3-axis directional capability. The method and related structures described provide electronic device structure with enhanced design flexibility and performance.

More particularly, in one embodiment, a method of forming an electronic device structure includes providing a first electronic component having a first major surface, an opposing second major surface, a first edge surface, and an opposing second edge surface. The method includes providing a substrate having a substrate first major surface and an opposing substrate second major surface. The method includes placing the second major surface of the first electronic component proximate to the substrate first major surface. The method includes providing a conductive material adjacent the first edge surface of the first electronic component. The method includes exposing the conductive material to an elevated temperature to reflow the conductive material to raise the first electronic component into an upright position such that the second edge surface is spaced further away from the substrate first major surface than the first edge surface.

In another embodiment, a method of forming an electronic device structure includes providing a first electronic component having a first major surface, an opposing second major surface, a first edge surface, and an opposing second edge surface. The method includes providing a substrate having a substrate first major surface, an opposing substrate second major surface, and a first conductive pattern adjacent the substrate first major surface. The method includes placing the second major surface of the first electronic component proximate to the substrate first major surface. The method includes providing a conductive material adjacent the first edge surface of the first electronic component and the first conductive pattern. The method includes exposing the conductive material to an elevated temperature to reflow the conductive material to raise the first electronic component into an upright position such that the second edge surface is spaced further away from the substrate first major surface than the first edge surface. In some examples, the method can include attaching a second electronic component to the substrate first major surface and providing a package body encapsulating the first electronic component and the second electronic component. In other examples, the providing the conductive material can include providing a solder material and conductive bumps substantially equally distributed along the first edge surface of the first electronic component. In some examples, providing the first electronic component comprises providing a semiconductor die configured as an antenna device, a sensor device, such as an image sensor device, or an optical device.

In a further embodiment, an electronic device structure includes a substrate having a substrate first major surface, an opposing substrate second major surface, and a first conductive pattern adjacent the substrate first major surface, and a first electronic component having a first major surface, an opposing second major surface, a first edge surface, an opposing second edge surface, and a first conductive pattern disposed adjacent at least the first major surface. The first edge surface is attached to the first conductive pattern with a conductive material. The first major surface is disposed generally orthogonal to the substrate first major surface such that the second edge surface is distal to the substrate first major surface. In some examples, the conductive material is electrically coupled to the first conductive pattern.

Other examples are included in the present disclosure. Such examples may be found in the figures, in the claims, and/or in the description of the present disclosure.

Figure 1:
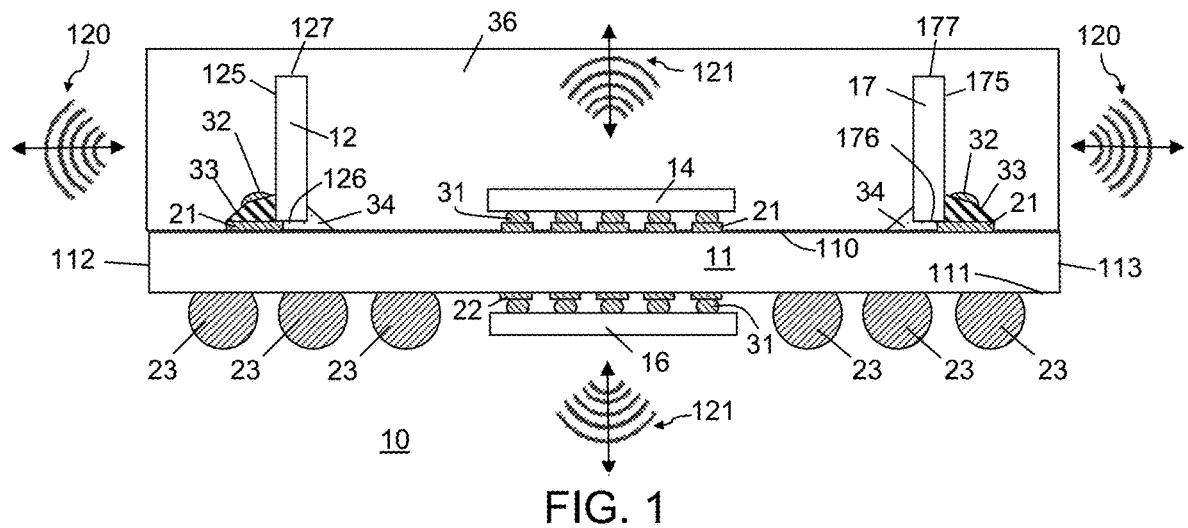
FIG. 1 illustrates a cross-sectional view of a packaged electronic device in accordance with an embodiment of the present invention taken along reference line 1-1 of FIG. 2.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, the term and/or includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. It is further understood that the embodiments illustrated and described hereinafter suitably may have embodiments and/or may be practiced in the absence of any element that is not specifically disclosed herein.

DETAILED DESCRIPTION OF THE DRAWINGS

Figure 2:
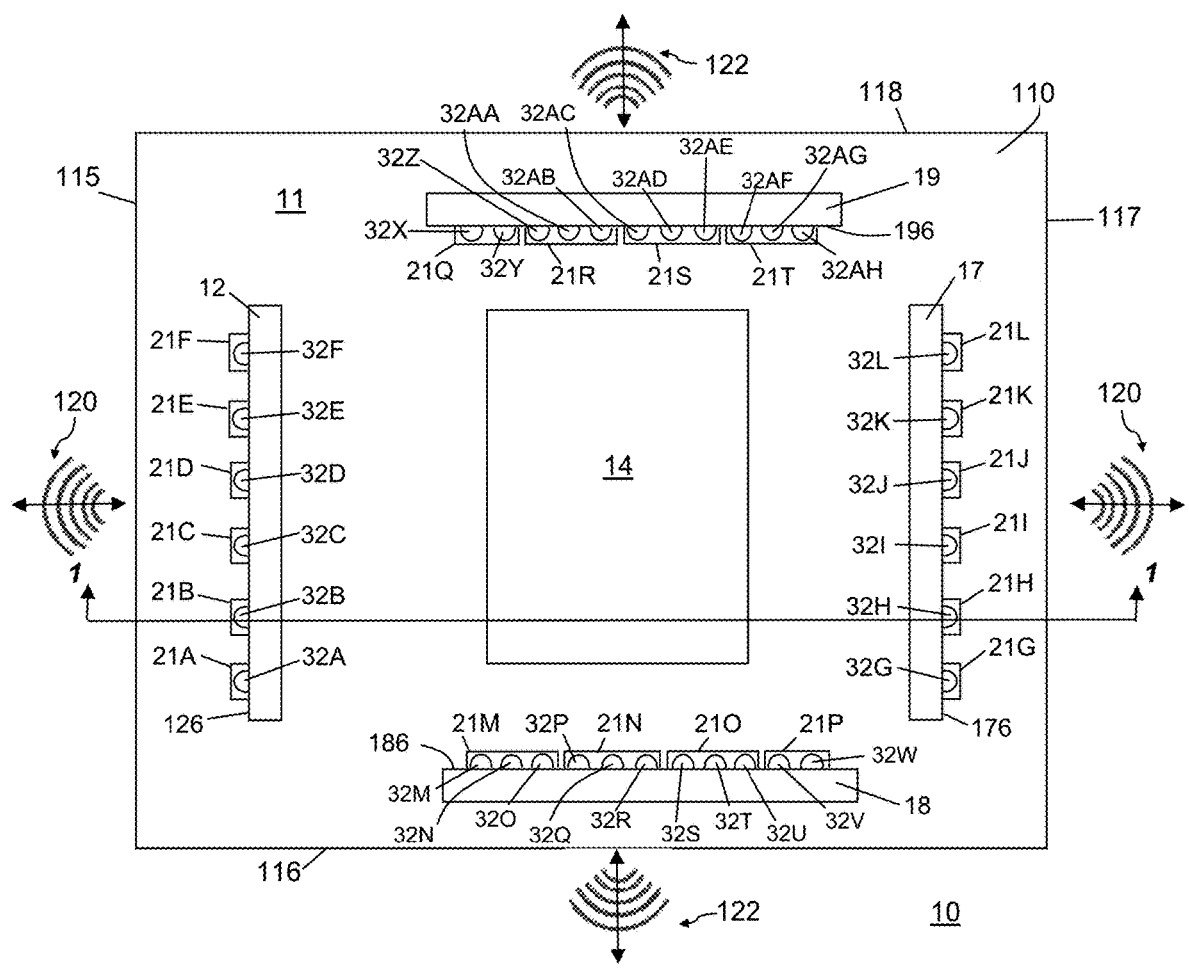
FIG. 2 illustrates a top plan view of a packaged electronic device in accordance with the present invention.

FIG. 1 illustrates a cross-sectional view of a packaged electronic device 10 in accordance with a first embodiment having electronic components 12, 14, 16, and 17 connected to a substrate 11. FIG. 1 is taken along reference line 1-1 of FIG. 2, which illustrates a top plan view of packaged electronic device 10. As illustrated in FIG. 2, packaged electronic device 10 further includes electronic components 18 and 19. FIGS. 1 and 2 illustrate an example of an electronic device structure having 3-axis directional capability.

In accordance with the present embodiment, electronic components 12 and 18 are provided as on-edge components 12 and 18 or as electronic components having a non-parallel orientation with respect to major surface 110 of substrate 11. In some embodiments, electronic component 12 and electronic component 18 can be provided with a generally orthogonal orientation with respect to major surface 110 of substrate 11. In one embodiment, electronic components 12, 14, 16, 17, 18, and 19 can be configured as antenna devices disposed on substrate 11 to provide 3-axis coverage. In some examples, one or more of electronic components 12, 14, 16, 17, 18, and 19 comprise semiconductor die, either packaged or unpackaged (i.e., bare semiconductor die). In other examples, one or more of electronic components 12, 14, 16, 17, 18 and 19 comprise passive components. By way of example, electronic components 12 and 17 are oriented to send and receive signals 120 along an x-axis of FIGS. 1 and 2; electronic components 14 and 16 are oriented to send and receive signals 121 along a z-axis of FIG. 1; and electronic components 18 and 19 are oriented to send and receive signals 122 along a y-axis of FIG. 2.

It is understood that other electronic components can be placed on substrate 11, but are not illustrated here so as to not crowd the figures. The other components can include integrated circuit devices, such as digital signal processing (DSP) devices, microprocessors, memory devices, microcontroller devices, power devices, passive devices, or other devices known to those skilled in the art. It is further understood that one or more of electronic components 12, 14, 16, 17, 18, and 19 can be other types of electronic devices, such as sensor devices (for example, CMOS or CCD image sensors), optical devices, or other devices known to those skilled in the art. Those skilled in the art will appreciate that the electronic components are illustrated in simplified form, and may further include multiple diffused regions, multiple conductive layers, and multiple dielectric layers.

Substrate 11 can be any kind of electronic component substrate, such as a printed circuit board (PCB), a build-up substrate, a laminate substrate, a leadframe substrate, a ceramic substrate, a molded substrate, a molded leadframe, or other substrates known to those skilled in the art. In one embodiment, substrate 11 is provided with a conductive pattern 21 adjacent to major surface 110 and a conductive pattern 22 adjacent to a major surface 111 opposite to major surface 110. Conductive patterns 21 and 22 can comprise conductive pads, conductive traces, or combinations thereof. In most embodiments, conductive patterns 21 and 22 comprise one or metal materials, such as copper, copper alloys, plated materials, gold, nickel gold, or other materials known to those skilled the art.

Substrate 11 can further include embedded traces and conductive interconnect vias (not shown) that electrically connect specific portions of conductive pattern 21 to other portions of conductive pattern 21, to conductive pattern 22, or to conductive bumps 23 provided adjacent major surface 111 of substrate 11. By way of example, conductive bumps 23 comprise temperature reflowable solder bumps, thermosonic or thermocompression bonded bumps (e.g., gold bumps), adhesively bonded bumps, or other bump materials known to those skilled in the art. Conductive bumps 23 are configured for attaching or electrically connected packaged electronic device 10 to a next level of assembly.

In some embodiments, electronic component 14 is attached to conductive pattern 21 with conductive bumps 31 and electronic component 16 is similarly attached to conductive pattern 22 with conductive bumps 31. Conductive bumps 31 can comprise temperature reflowable solder bumps, thermosonic or thermocompression bonded bumps (e.g., gold bumps), adhesively bonded bumps, or other bump materials known to those skilled in the art.

In accordance with the present embodiment, electronic component 12 is attached at an edge 126 to conductive pattern 21 using one or more conductive bumps 32 and solder 33. In some embodiments, edge 126 only partially overlaps conductive pattern 21 with conductive bumps 32 and solder 33 overlapping conductive pattern 21. An opposite edge 127 is disposed distal to major surface 110 of substrate 11. Electronic component 17 is attached at an edge 176 to conductive pattern 21 using one or more conductive bumps 32 and solder 33. An opposite edge 177 is disposed distal to major surface 110 of substrate 11. By way of example, conductive bumps 32 comprise lead-free solder balls or bumps (for example, tin (Sn) silver (Ag)). In accordance with the present embodiment, and as will be explained in more detail with FIGS. 3 and 5, during a reflow process that attaches or bonds electronic components 12, 14, 16, 17, 18 and 19 to substrate 11, a surface tension effect from the melted or softened solder and the conductive bumps is utilized to raise-up or pull-up electronic components 12, 17, 18 and 19 into an upright or non-parallel orientation with respect to major surface 110 of substrate 11. Stated a different way, after the reflow process, electronic components 12, 17, 18, and 19 are disposed on substrate 11 in an on-edge configuration such that the major surfaces of these components are other than generally parallel with major surface 110 of substrate 11. In one embodiment, an underfill layer 34 can be disposed adjacent to edges of electronic components 12, 17, 18, and 19 proximate to major surface 110 of substrate 11 to provide additional support or protection for electronic components 12, 17, 18, and 19 after electronic components 12, 17, 18, and 19 are placed in a desired upright orientation. Although not illustrated in the present example, underfill layers can also be used under electronic components 14 and 16. Solder 33 can be a lead-free solder, such as tin (Sn) silver (Ag) solder, and can be provided as a solder paste. In accordance with the present embodiment, electronic components 12, 17, 18, and 19 are attached at only one edge to substrate 11. In some examples, one or more of solder 33 and conductive bumps can be referred to as conductive material. As illustrated in FIG. 1, electronic component 12 has a major surface 125 that faces an edge 112 of substrate 11, and electronic component 17 has a major surface 175 that faces an edge 113 of substrate. It is understood that electronic components 18 and 19 also have major surfaces that face other edges 118 and 116 of substrate 11 as illustrated in FIG. 2.

In some embodiments, a package body 36 encapsulates or covers electronic components 12, 14, 17, 18, and 19. In some embodiments, package body 36 can be a polymer based composite material, such as an epoxy resin with filler, epoxy acrylate with filler, or polymer with proper filler. Package body 36 comprises a non-conductive and environmentally protective material that protects electronic components 12, 14, 17, 18, and 19 from external elements and contaminants. Package body 36 may be formed using paste printing, compressive molding, transfer molding, overmolding, liquid encapsulant molding, vacuum lamination, other suitable applicator, or other processes as known to those of skill in the art. In some embodiments, package body 36 is an epoxy mold compound ("EMC"), and can be formed using transfer or injection molding techniques. In other embodiments, another package body (not shown) may be used to encapsulate electronic component 16 disposed adjacent major surface 111 of substrate 11. In other embodiments, package body 36 may comprise a cap, lid, or other cover structures known to those skilled in the art. In other embodiments, package body 36 is not used.

With reference now to FIG. 2, examples of attachment schemes will be described. In one embodiment, only one side or one edge 126 of electronic component 12 is attached to individual conductive pads 21A to 21F using conductive bumps 32A to 32F and solder layer 33 or solder layers 33. In one embodiment, only one side or one edge 176 of electronic component 17 is attached to individual pads 21G to 21L using conductive bumps 32G to 32L and solder layer 33 or solder layers 33 (examples of solder layers 33 are illustrated in FIG. 1). In some embodiments, it is preferred that the conductive pads 21A to 21F are substantially equally distributed along edge 126 of electronic component 12 and that conductive pads 21G to 21L are substantially equally distributed along edge 176 of electronic component 17. As illustrated in FIG. 2, conductive pads 21A to 21F and conductive bumps 32A to 32F are disposed between an outer edge 115 of substrate 11 and electronic component 12. That is, an active surface of electronic component 12 is adjacent to or proximate to conductive bumps 32A to 32F. As is further illustrated in FIG. 2, conductive pads 21G to 21L and conductive bumps 32G to 32L are disposed between an outer edge 117 of substrate 11 and electronic component 17. That is, an active surface of electronic component 17 is adjacent to or proximate to conductive bumps 32G to 32L.

In one embodiment, only one side or edge 186 of electronic component 18 is attached to individual conductive pads 21M to 21P using conductive bumps 32M to 32W and solder layer 33 or solder layers 33. In the present embodiment, at least some of conductive pads 21M to 21P accommodate more than one conductive bump 32M to 32W. In some embodiments, it is preferred that conductive pads 21M to 21P are substantially equally distributed along a lower edge 186 of electronic component 18. As illustrated in FIG. 2, electronic component 18 is disposed between an outer edge 116 of substrate 11 and conductive pads 21M to 21P and conductive bumps 32M to 32W. That is, in one embodiment, an active surface of electronic component 18 is opposite to conductive bumps 32M to 32W.

In one embodiment, only one side or edge 196 of electronic component 19 is attached to individual conductive pads 21Q to 21T using conductive bumps 32X to 32AF and solder layer 33 or solder layers 33. In the present embodiment, at least some of conductive pads 21Q to 21T accommodate more than one conductive bump 32X to 32AF. In some embodiments, it is preferred that conductive pads 21Q to 21T are substantially equally distributed along a lower edge 196 of electronic component 19. As illustrated in FIG. 2, electronic component 19 is disposed between an outer edge 118 of substrate 11 and conductive pads 21Q to 21T and conductive bumps 32X to 32AF. That is, in one embodiment, an active surface of electronic component 18 is opposite to conductive bumps 32X to 32AF.

It is understood that the number of conductive pads and solder bumps are determined by the electrical I/O requirements of the electronic components and the cumulative volume of material needed to raise the electronic component into a desired upright position. It if further understood that some of the conductive pads and solder bumps may not provide electrical connectivity, but instead may be used to provide the surface tension effect of the present disclosure to attach the electronic component(s) to the substrate.

Figure 3:
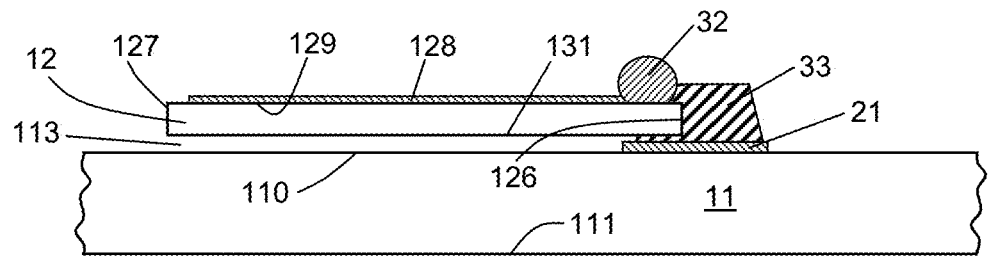
FIG. 3 illustrates a partial cross-sectional view of an electronic device in accordance with an embodiment of the present invention at a step in fabrication.

FIG. 3 illustrates a partial cross-sectional view of an example electronic device 30 in accordance with an embodiment at an early step of fabrication. In the present example, electronic component 12 includes a conductive pattern 128 disposed on an upward facing major surface 129, and is disposed with edge 126 adjoining conductive pattern 21 on substrate 11. In the present embodiment, a major surface 131 of electronic component 12 faces major surface 110 of substrate 11, but is spaced apart from major surface 110 to provide a gap 113. Conductive bump 32 is disposed adjacent to major surface 129 of electronic component 12, and solder layer 33 is disposed on conductive pattern 21 and contacts edge 126 and solder bump 32. In the present embodiment, major surface 129 can be the active surface of electronic component 12, which is on the same side as conductive bump 32. In accordance with the present embodiment, edge 127 of electronic component 12, which is opposite to edge 126, is provided absent any conductive bumps 32. Stated a different way, conductive bumps 32 are disposed only along or next to edge 126 of electronic component 12.

Figure 4:
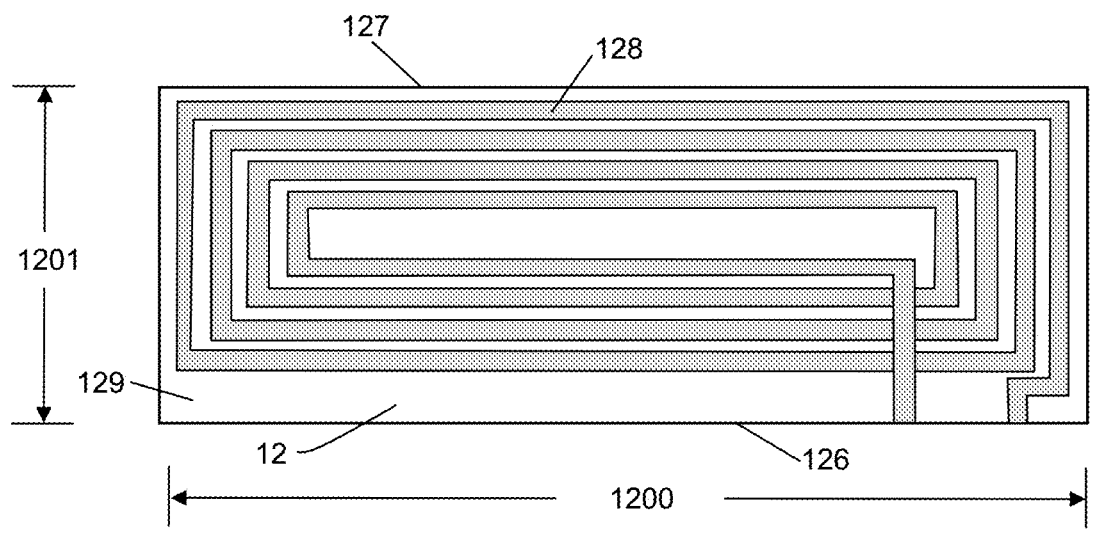
FIG. 4 illustrates a top plan view of an electronic component in accordance with an embodiment of the present invention.

FIG. 4 is a top plan view of electronic component 12 in accordance with an example preferred embodiment. More particularly, electronic component 12 preferably has a width 1200 to height 1201 ratio or aspect ratio greater than one (1), such a width to height ratio of about five (5) to one (1) with a standard thickness in range from about 100 microns to about 200 microns. This aspect ratio is preferred to facilitate raising electronic component 12 to an elevated position, such as an upright position, in a subsequent fabrication step, such as a solder reflow process. Further, in accordance with the present embodiment, the width to height ratio of electronic component 12 can be used to determine the number and size of conductive bumps and the volume of solder 33 to use in order to raise electronic component 12 to a desired position during the solder reflow process.

Figure 5:
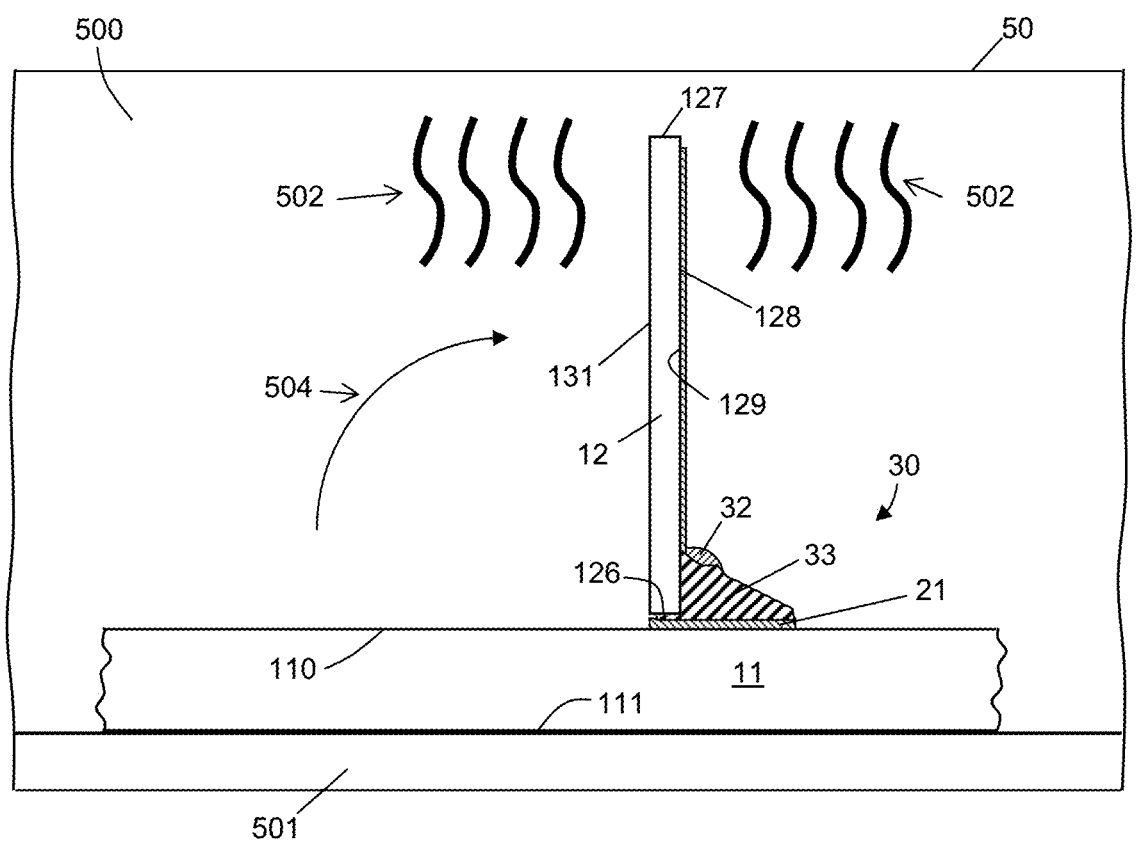
FIG. 5 illustrates a partial cross-sectional view of the electronic device of FIG. 3 at another step of fabrication within a manufacturing apparatus.

FIG. 5 illustrates a partial cross-sectional view of electronic device 30 of FIG. 3 at a later step in fabrication within a manufacturing apparatus 50 in accordance with one embodiment. By way of example, manufacturing apparatus 50 can be a reflow furnace having a chamber 500, a support structure 501, and a heat source 502. In accordance with the present embodiment, during the reflow process, surface tension forces act to move electronic component 12 to a raised orientation, such as an upright orientation. More particularly, adhesion forces between solder 33, conductive bump 31 and electronic component 12 create a moment 504 of the surface tension force that rotates electronic component 12 about edge 126 thereby raising electronic component 12 to an upright position. In accordance with the present embodiment, moment 504 results because opposing edge 127 of electronic component 12 is not attached to substrate 11 during the reflow process. In one embodiment, electronic component 12 has a generally orthogonal orientation with respect to major surface 110 of substrate 11. By way of example, electronic device 30 may be exposed to a temperature in a range of about 220 degrees Celsius to about 250 degrees Celsius for about 30 to 90 seconds when lead-free solder materials are used.

Figure 6:
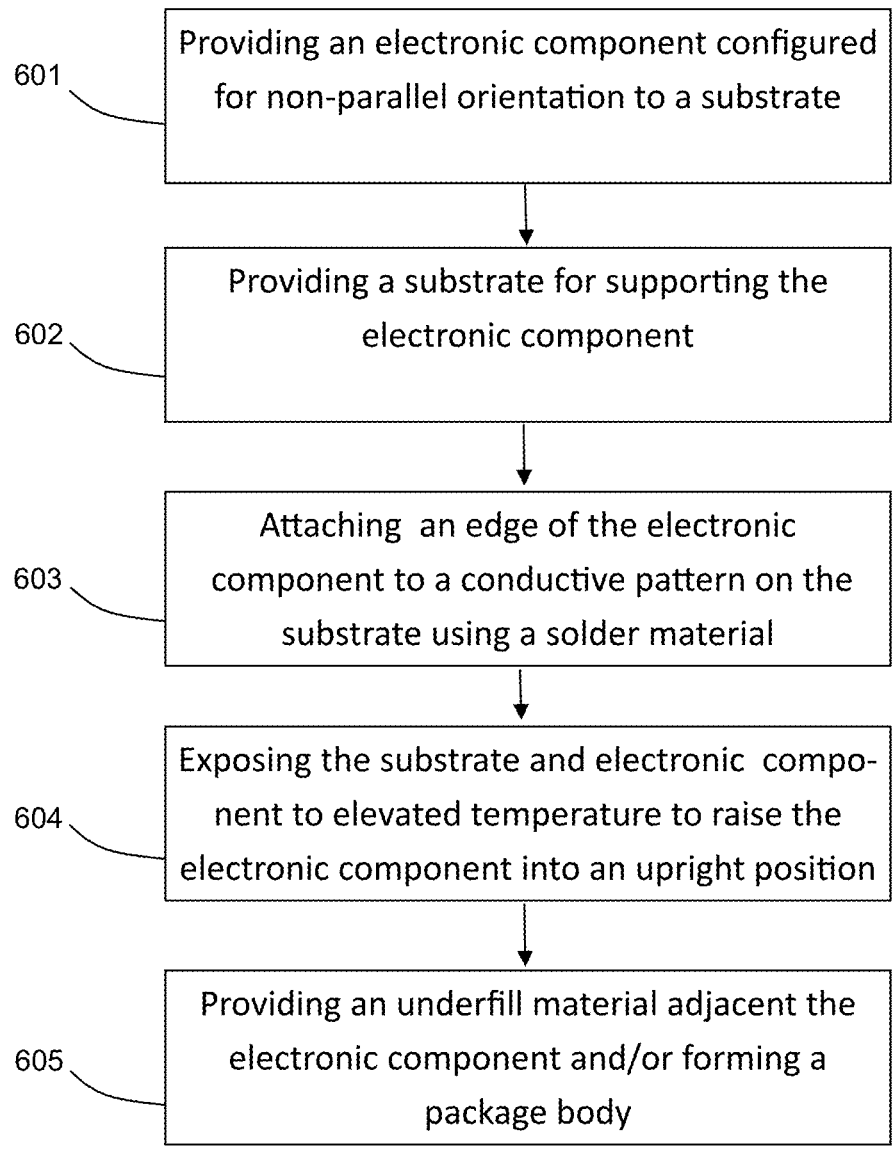
FIG. 6 is a flow chart for manufacturing a packaged electronic device in accordance with an embodiment of the present invention.

FIG. 6 is a flow chart for manufacturing a packaged electronic device in accordance with an embodiment of the present description. In a step 601, an electronic component configured for a non-parallel orientation with respect to a substrate is provided. By way of example, the electronic component can be an antenna device, a sensor device, or an optical device. In some embodiments, the electronic component can be electronic components 12 or 18 as illustrated in FIGS. 1-3, or any of the electronic components illustrated in FIGS. 7-13 hereinafter. In some preferred embodiments, the electronic component has a width to height ratio of about 5 to 1. In some embodiments, the electronic component is provided with conductive bumps, such as conductive bumps 32, disposed on surface of the electronic component proximate to an edge of the electronic component along its width dimension.

In a step 602, a substrate for supporting the electronic component is provided. By way of example, the substrate can be a PCB substrate, build-up substrate, a laminate substrate, a leadframe substrate, a ceramic substrate, a molded substrate, a molded leadframe, or other substrates known to those skilled in the art. In some embodiments, the substrate can be substrate 11 provided with conductive patterns 21 and 22 for receiving one or more electronic components.

In a step 603, the electronic component is attached to the substrate using a solder material. By way of example, a pick-and-place apparatus may be used to place the electronic components in desired locations on the substrate. In some embodiments, solder material 33 is used to preliminarily attach the electronic device along only the edge having conductive bumps 32. That is, the edge opposite the edge having conductive bumps 32 is not attached to the substrate. By way of example, the solder materials can be first dispensed in desired amounts on desired locations on the conductive patterns before the electronic components are placed onto the substrate. A dispensing or screen printing process can be used to provide the solder materials on desired locations of the substrate. In some embodiments, the solder material at least partially covers respective portions of conductive pattern 21 where the electronic component is attached to the substrate. By way of example, the solder material can comprise a SnAg or other lead-free solders, may include a flux material, and may be provided as a solder paste. In step 603, other electronic components may be attached to the substrate in conventional configurations. Such other components can be integrated circuit devices, such as DSP devices, microprocessors, memory devices, microcontroller devices, power devices, passive devices, or other devices known to those skilled in the art.

In a step 604, the substrate and electronic components are exposed to an elevated temperature to reflow the conductive bumps and solder materials to permanently attach the electronic components to the substrate. In accordance with the present embodiment, at least one electronic component is raised to an elevated position during step 604 so that it is finally attached to the substrate in a non-parallel orientation to the substrate. By way of example, this can be electronic component 12 illustrated in FIGS. 1 and 5, electronic component 1012 illustrated in FIG. 10, or electronic component 12 illustrated in FIG. 13. Stated a different way, after step 604, major surface 129 of electronic component 12 is a non-parallel orientation with respect to major surface 110 of substrate 11 as illustrated in FIG. 5.

In an optional step 605, a package body can be provided to cover or encapsulate at least portions of the substrate and the electronic components. In some embodiments, package body 36 can be used and can be polymer based composite material, such as epoxy resin with filler, epoxy acrylate with filler, or polymer with proper filler. The package body may be formed using paste printing, compressive molding, transfer molding, over-molding, liquid encapsulant molding, vacuum lamination, other suitable applicator, or other processes as known to those of skill in the art. In some embodiments, an underfill material, such as underfill material 34 illustrated in FIG. 1, is placed between the electronic components and the substrate before the package body is provided.

Figure 8:
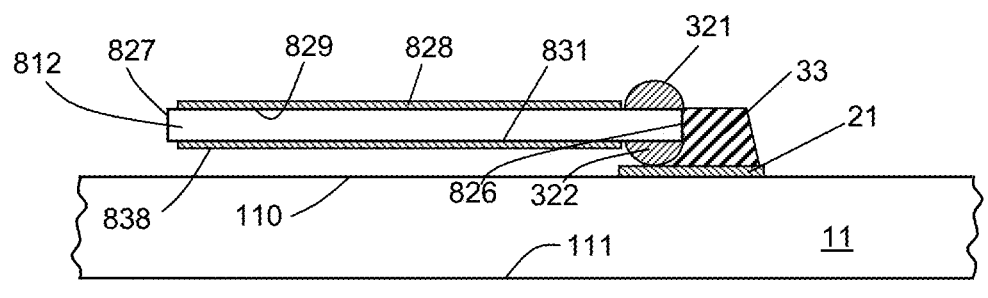
FIG. 8 illustrates a partial cross-sectional view of an electronic device in accordance with an embodiment of the present invention.
Figure 9:
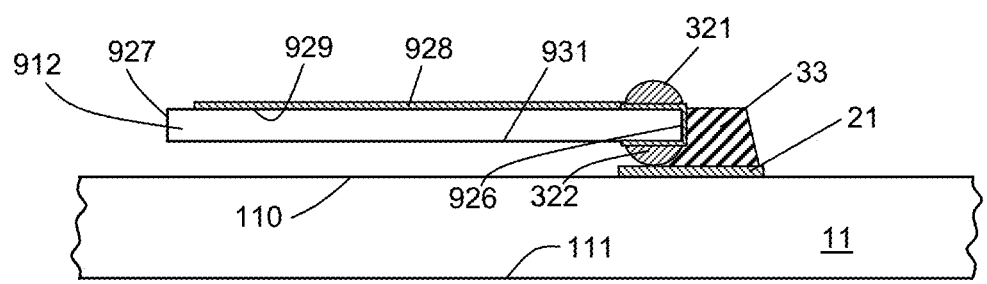
FIG. 9 illustrates a partial cross-sectional view of an electronic device in accordance with an embodiment of the present invention.
Figure 10:
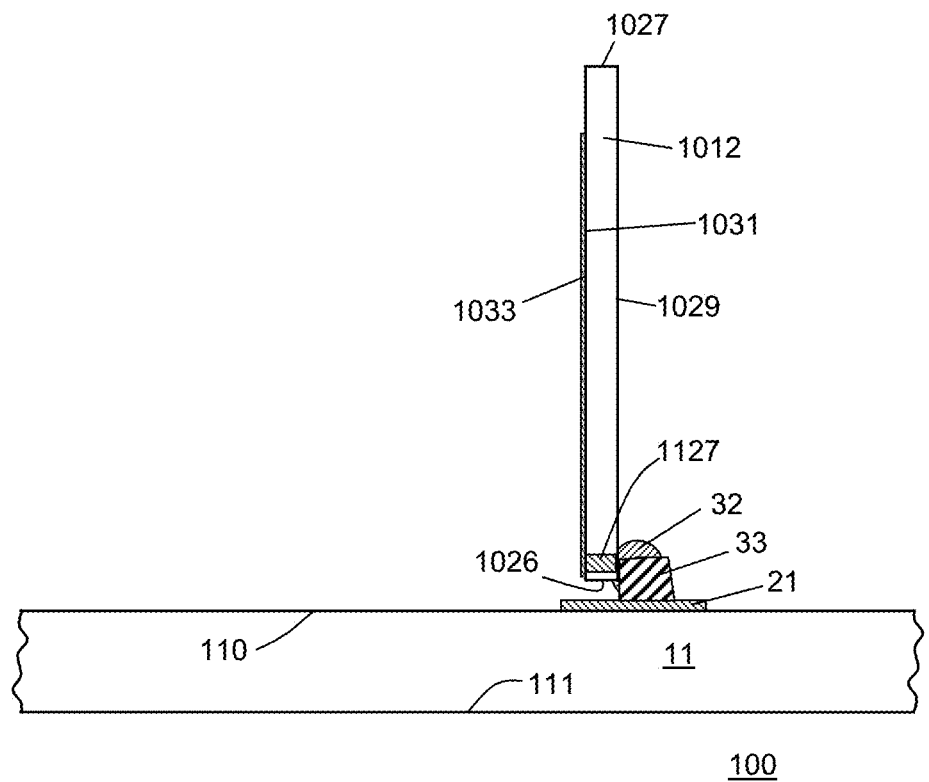
FIG. 10 illustrates a partial cross-sectional view of an electronic device in accordance with an embodiment of the present invention.
Figure 11:
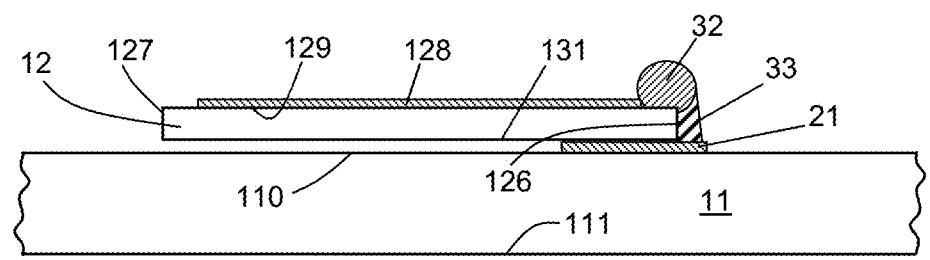
FIG. 11 illustrates a partial cross-sectional view of an electronic device in accordance with an embodiment of the present invention.
Figure 12:
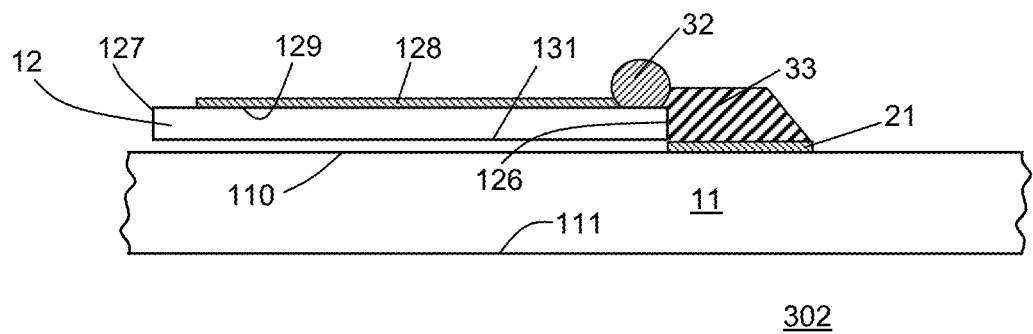
FIG. 12 illustrates a partial cross-sectional view of an electronic device in accordance with an embodiment of the present invention.
Figure 13:
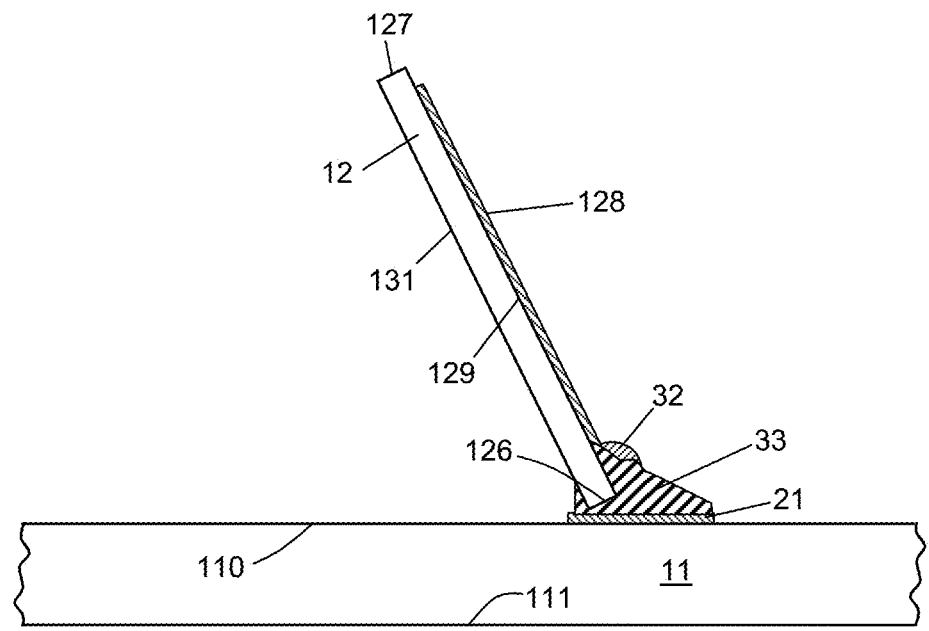
FIG. 13 illustrates a partial cross-sectional view of an electronic device in accordance with an embodiment of the present invention.

Turning now to FIGS. 7-13 alternative embodiments will now be described. In FIGS. 7-9, 11, and 12, the electronic components are illustrated before the reflow process. Stated a different way, the electronic components have not yet be raised to an upright position. It is understood that after a reflow process, the electronic components in FIGS. 7-9, 11 and 12 are in a raised configuration. In FIGS. 10 and 13, the electronic components are illustrated in a raised configuration.

Figure 7:
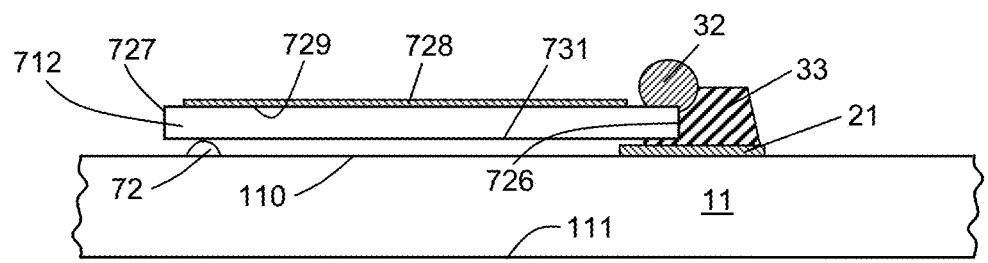
FIG. 7 illustrates a partial cross-sectional view of an electronic device in accordance with an embodiment of the present invention.

FIG. 7 illustrates a partial cross-sectional view of an electronic device 70 in accordance with an embodiment of the present description, which has an electronic component 712 attached at an edge 726 to conductive pattern 21 on substrate 11. Electronic device 70 is similar to electronic device 30, and only the main differences between the devices will be described hereinafter. In the present embodiment, substrate 11 is further provided with a structure 72, such as a stand-off 72, pad 72, or bump 72, which is configured to provide temporary support to electronic component 712 adjacent to major surface 731 before electronic component 712 is raised to an elevated position above major surface 110 of substrate 11. Structure 72 can comprise a material that does not adhere to electronic component 712 during the reflow process. In some embodiments, structure 72 comprises a polymer material, a ceramic material, or other materials known to those skilled in the art. In addition, electronic component 712 is provided with a conductive layer 728 on major surface 729 that is laterally spaced apart from conductive bump 32. More particularly, electronic component 712 is not in electrical communication with at least one conductive bump 32. Similar to electronic device 30, edge 726 of electronic component 712 overlaps only a portion of conductive pattern 21. In accordance with the present embodiment, edge 727 of electronic component 712, which is opposite to edge 726, is provided absent any conductive bumps 32. Stated a different way, conductive bumps 32 are disposed only along or next to edge 726 of electronic component 712.

FIG. 8 illustrates a partial cross-sectional view of an electronic device 80 in accordance with another embodiment of the present description, which has an electronic component 812 attached at edge 826 to conductive pattern 21 on substrate 11. Electronic device 80 is similar to electronic devices 30 and 70, and only the main differences between the devices will be described hereinafter. In the present embodiment, electronic component 812 is provided with a conductive layer 828 on a major surface 829 and a conductive layer 833 on a major surface 831. Stated differently, electronic component 812 has active devices on two opposing major surfaces. In addition, conductive bumps 321 and 322 are provided on the opposing major surfaces 829 and 831 respectively of electronic component 812. More particularly, in the present embodiment, conductive bump 322 physically contacts conductive pattern 21 proximate to edge 826 of electronic component 812. In accordance with the present embodiment, edge 827 of electronic component 812, which is opposite to edge 826, is provided absent any conductive bumps 321 or 322. Stated a different way, conductive bumps 321 and 322 are disposed only along or next to edge 826 of electronic component 812.

FIG. 9 illustrates a partial cross-sectional view of an electronic device 90 in accordance with a further embodiment of the present description, which has an electronic component 912 attached at edge 926 to conductive pattern 21 on substrate 11. Electronic device 90 is similar to electronic devices 30, 70, and 80, and only the main differences between the devices will be described hereinafter. In the present embodiment, electronic component 912 is provided with a conductive layer 928 on a major surface 929, which extends to overlap edge 926, and extends to be adjacent to at least portion of a major surface 931. Conductive bumps 321 and 322 are provided on the opposing major surfaces 929 and 931 respectively of electronic component 912. More particularly, in the present embodiment, conductive bump 322 physically contacts conductive pattern 21 proximate to edge 926 of electronic component 912. In accordance with the present embodiment, edge 927 of electronic component 912, which is opposite to edge 926, is provided absent any conductive bumps 321 or 322. Stated a different way, conductive bumps 321 and 322 are disposed only along or next to edge 926 of electronic component 912.

FIG. 10 illustrates a partial cross-sectional view of an electronic device 100 in accordance with another embodiment of the present description, which has an electronic component 1012 attached at an edge 1026 to conductive pattern 21 on substrate 11. Electronic device 100 is similar to electronic devices 30, 70, 80, and 90, and only the main differences between the devices will be described hereinafter. In the present embodiment, electronic component 1012 is illustrated in a raised or upright configuration. In the present embodiment, electronic component 1012 is provided with a conductive through-substrate via (TSV) 1127 that extends from a major surface 1029 of electronic component 1012 to an opposing major surface 1031, which electrically connects conductive bump 32 adjacent to a major surface 1029 to a conductive layer 1033 disposed adjacent to major surface 1031. In electronic component 1012, major surface 1031 is an active surface that is in electrical communication with conductive pattern 21 through TSV 1127, conductive bump 32, and solder 33. In accordance with the present embodiment, edge 1027 of electronic component 1012, which is opposite to edge 1026, is provided absent any conductive bumps 32. Stated a different way, conductive bumps 32 are disposed only along or next to edge 1026 of electronic component 1012.

FIG. 11 illustrates a partial cross-sectional view of an electronic device 301 in accordance with a further embodiment of the present description, which has electronic component 12 attached at an edge 126 to conductive pattern 21 on substrate 11. Electronic device 301 is similar to electronic device 30, and only the main differences between the devices will be described hereinafter. In the present embodiment, electronic component 12 overlaps a majority of conductive pattern 21. That is, electronic component 12 overlaps at least half of conductive pattern 21 in a cross-sectional view. In accordance with the present embodiment, edge 127 of electronic component 12, which is opposite to edge 126, is provided absent any conductive bumps 32. Stated a different way, conductive bumps 32 are disposed only along or next to edge 126 of electronic component 12.

FIG. 12 illustrates a partial cross-sectional view of an electronic device 302 in accordance with another embodiment of the present description, which has electronic component 12 attached at an edge 126 to conductive pattern 21 on substrate 11. Electronic device 302 is similar to electronic devices 30 and 301, and only the main differences between the devices will be described hereinafter. In the present embodiment, electronic component 12 does not overlap conductive pattern 21 prior to electronic component being raised to an upright position.

FIG. 13 illustrates a partial cross-sectional view of an electronic device 303 in accordance with a further embodiment of the present description, which has electronic component 12 attached at an edge 126 to conductive pattern 21 on substrate 11. In the present embodiment, electronic component is provided in a raised position such that major surface 129 of electronic component 12 is not parallel to major surface 110 of substrate 11. Further, in the present embodiment, major surface 129 of electronic component 12 is other than orthogonal to major surface 110 of substrate 11. Stated a different way, electronic component 12 is in a raised position that is greater than zero degrees with respect to major surface 110 of substrate 11 and that is less than 90 degrees.

In view of all of the above, it is evident that a novel method and related structures have been disclosed that provide an electronic component in an on-edge or an upright configuration. In some examples, an edge of an electronic component is placed adjacent a conductive pattern on a substrate. A conductive material is placed adjacent the edge and the conductive pattern. The conductive material is exposed to elevated temperature configured to reflow the conductive material. During the reflow process, a surface tension effect acts to raise or rotate the electronic component upward into an upright or on-edge orientation. In some examples, the conductive material includes a solder and conductive bumps, which can be substantially equally distributed along the edge of the electronic component. In some examples, the electronic component can be an antenna structure, such as a semiconductor antenna structure. In other examples, the electronic component can be a sensor device, such as an image sensor device. In some examples, the electronic component is a bare semiconductor die or chip (i.e., unpackaged). In some embodiments, the electronic component includes a conductive electrically connected to one or more of the conductive bumps disposed along the edge. In some examples, the conductive pattern can be on both sides of the electronic component. Multiple electronic components can be disposed on a substrate in both an on-edge configuration and in a conventionally attach configuration to provide an electronic device structure having 3-axis directional capability. The method and related structures described provide electronic device structure with enhanced design flexibility and performance. In addition, the method and relates structures that can support upcoming electronic component demands, such as 5G applications.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. By way of example, multiple electronic devices can be attached to a substrate in side-by-side configurations, in stacked configurations, combinations thereof, or other configurations known to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. An electronic device structure comprising:
a substrate having a substrate first major surface, an opposing substrate second major surface, and a first conductive pattern adjacent to the substrate first major surface;
a first electronic component having a first major surface, an opposing second major surface, a first edge surface, and an opposing second edge surface; and
a package body encapsulating the first electronic component,
wherein:
the first edge surface is attached to the first conductive pattern with a conductive material so that the first electronic component is an upright position with the second edge surface spaced further away from the substrate major surface than the first edge surface;
the conductive material comprises conductive bumps;
the first electronic component has a width-to-height ratio greater than one (1) where the width is defined by a length of the first edge surface parallel to the first major surface of the first electronic component and the height is defined by a side of the first electronic component extending between the first edge surface and the second edge surface;
the first electronic component comprises a first antenna device proximate the first major surface; and
at least part of the first major surface is devoid of the conductive material.

2. The electronic device structure of claim 1, further comprising:
an underfill layer interposed between the first edge surface and the substrate first major surface; and
a package body covering the first electronic component and the underfill layer.

3. The electronic device structure of claim 1, wherein:
the first electronic component comprises a semiconductor die; and the width-to-height ratio is about 5 to 1.

4. The electronic device structure of claim 1, wherein:
the conductive material further comprises a solder material.

5. The electronic device structure of claim 1, wherein:
the conductive bumps are laterally disposed along the first edge surface of the first electronic component.

6. The electronic device structure of claim 1, wherein:
the first electronic component further comprises a second conductive pattern.

7. The electronic device structure of claim 6, wherein:
the second conductive pattern comprises a first portion adjacent to the first major surface and a second portion adjacent to the second major surface.

8. The electronic device structure of claim 7, wherein:
the first portion is coupled to the second portion by a conductive structure that overlaps the first edge surface of the first electronic component.

9. The electronic device structure of claim 6, further comprising:
a through-substrate via (TSV) extending through the first electronic component, wherein:
the through-substrate via (TSV) electrically couples the second conductive pattern to the first conductive pattern.

10. The electronic device structure of claim 1, wherein:
the conductive bumps are disposed proximate to the first edge surface and proximate to both the first major surface and the second major surface of the first electronic component.

11. The electronic device structure of claim 1, wherein:
the electronic device structure further comprises a second electronic component attached to the substrate first major surface in an upright position;
the second electronic component comprises a second antenna device proximate to a first major surface of the second electronic component;
the first antenna device faces a first direction;
the second antenna device faces a second direction; and
the second direction is different than the first direction.

12. The electronic device structure of claim 11, wherein:
the electronic device structure further comprises a third electronic component attached to the substrate second major surface;
the third electronic component comprises a third antenna device proximate to a first major surface of the third electronic component;
the third antenna device faces a third direction; and
the third direction is different than the first direction and the second direction.

13. An electronic device structure comprising:
a substrate having a substrate first major surface, an opposing substrate second major surface, and a first conductive pattern adjacent the substrate first major surface; and
a first semiconductor die having a first major surface, an opposing second major surface, a first edge surface, an opposing second edge surface, and a first conductive layer over a portion the first major surface, over the first edge surface, and over a portion of the second major surface, wherein:
the first semiconductor die is attached to the substrate first major surface at the first edge surface so that the first semiconductor die is standing upright to space the second edge surface away from the substrate first major surface;
the first edge surface is attached with a conductive material comprising conductive bumps;
a first conductive bump is coupled to the first conductive layer proximate to the first major surface;
a second conductive bump is coupled to the first conductive layer proximate to the second major surface; and
the first conductive bump is electrically coupled to the second conductive bump.

14. The electronic device structure of claim 13, wherein:
the conductive material further comprises solder.

15. The electronic device structure of claim 13, wherein:
the first semiconductor die is electrically coupled to the first conductive pattern through the first conductive layer, the first conductive bump and the second conductive bump.

16. The electronic device structure of claim 13, further comprising:
a second semiconductor die having a first major surface, an opposing second major surface, a first edge surface, and an opposing second edge surface, wherein the first edge surface of the second semiconductor die is attached to the substrate first major surface so that second semiconductor die is standing upright to space the second edge surface of the second semiconductor die away from the substrate first major surface;
a third semiconductor die having a first major surface and an opposing second major surface that is attached to the substrate second major surface; and
a package body encapsulating the first semiconductor die and the second semiconductor die, wherein:

the first semiconductor die, the second semiconductor die, and the third semiconductor die each have an antenna element on their respective first major surfaces;

the first major surface of the first semiconductor die faces a first direction;

the first major surface of the second semiconductor die faces a second direction;

the first major surface of the third semiconductor die faces a third direction; and the first direction, the second direction, and the third direction are different directions.

17. The electronic device structure of claim 13, wherein:
the first semiconductor die has a width-to-height ratio greater than one (1) where the width is defined by a length of the first edge of the first semiconductor die parallel to the first major surface of the first semiconductor die and the height is defined by a side of the first electronic die extending between the first edge of the first semiconductor die and the second edge of the first semiconductor die.

18. An electronic device structure, comprising:
a substrate having a substrate first major surface, an opposing substrate second major surface, and a substrate conductive pattern adjacent the substrate first major surface;

a first semiconductor die having a first major surface, an opposing second major surface, a first edge, an opposing second edge, and a first conductive pattern disposed adjacent at least the first major surface;

a conductive material coupling the first semiconductor die to substrate conductive pattern so that the first edge is proximate to the substrate conductive pattern and the second edge is distal the substrate conductive pattern, the conductive material covering a portion of the first major surface of the semiconductor die proximate to the substrate conductive pattern and covering a portion of substrate conductive pattern; and an underfill interposed between the first edge and the substrate first major surface, the underfill abutting a side surface of the substrate conductive pattern, wherein:

the underfill contacts a portion of the second major surface of the first semiconductor die proximate to the first edge; and the conductive material is electrically coupled to the first conductive pattern.

19. The structure of claim 18, further comprising:
a package body encapsulating the first semiconductor die, wherein:

the conductive material comprises conductive bumps;

the first major surface of the first semiconductor die faces a first edge of the substrate; and the first semiconductor die have a width-to-height ratio of about 5 to about 1.

20. The structure of claim 18, wherein:
the conductive material comprises conductive bumps;
the first semiconductor die further comprises:
a through-substrate via (TSV) extending from the first major surface to the second major surface; and
the through-substrate via (TSV) electrically couples at least one conductive bump to the first conductive pattern.

* * * * *